Figure 1:
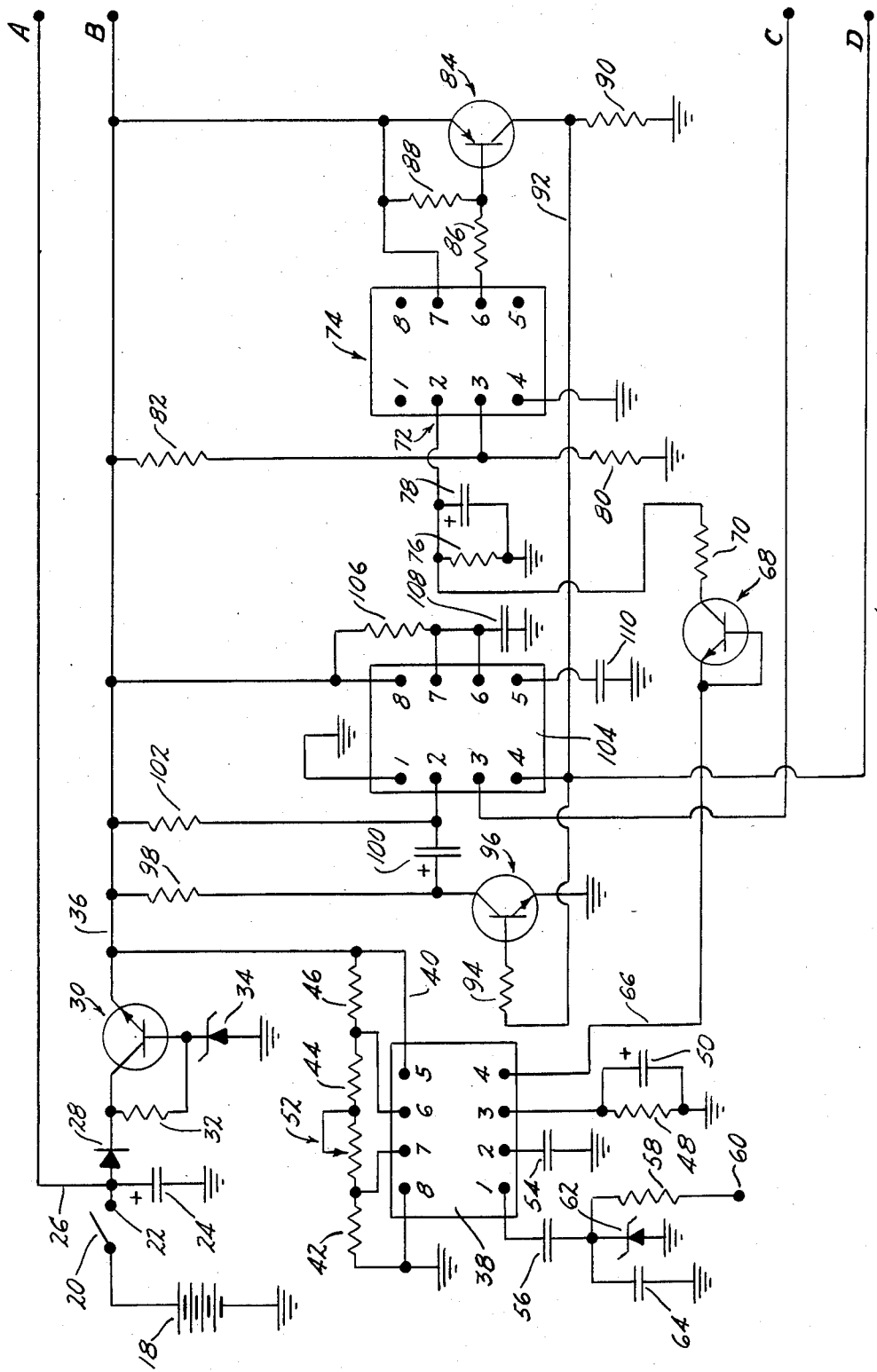

United States Patent [19]

Lupoli

[11] Patent Number: 4,604,864

[45] Date of Patent: Aug. 12, 1986

[54] CONTROL CIRCUIT FOR USE WITH AIR-DIVERTER VALVE OF INTERNAL COMBUSTION ENGINE

[75] Inventor: Peter J. Lupoli, Hamden, Conn.

[73] Assignee: Casco Products Inc., Bridgeport, Conn.

[21] Appl. No.: 608,711

[22] Filed: May 10, 1984

[51] Int. Cl.⁴ ............................................... F01N 3/22
[52] U.S. Cl. ....................................................... 60/290
[58] Field of Search ................................. 60/289, 290

[56] References Cited

U.S. PATENT DOCUMENTS 4,240,253 12/1980 Nakamura .............................. 60/290
4,271,667 6/1981 Mitsuda ................................. 60/290

Primary Examiner—Douglas Hart
Attorney, Agent, or Firm—Cynthia Berlow; Mitchell D. Bittman

[57] ABSTRACT

An electronic control circuit for actuating a solenoid-operated air-diverter valve or valves connected with the exhaust manifold of an internal combustion engine, to supply supplemental air thereto. The supplemental air reacts with some of the hot exhaust gases, producing other gases which are in general less toxic than those coming directly from the engine. The circuit responds to engine speed in such a manner that, after a predetermined period of operation has elapsed during which the speed was continuously above a predetermined value, the normally energized solenoids are shut off to thus close the diverter valves and thereby interrupt the flow of supplemental air to the exhaust manifold. This prevents overheating of the exhaust system at high engine speeds. Provision is made for automatically modifying the operation of the circuit if the engine speed varies or fluctuates between relatively high and low speeds, and circuit operation is dependent on the relative time intervals involved with each type of operation. Self-diagnostic controls are also included, in order to assist the vehicle operator in determining that the circuit is functioning properly. The arrangement is such that the air-diverter valves are open most of the time, in order to minimize overall exhaust pollutants, but close when necessary in order to prevent excessive heat in the exhaust system from being developed.

11 Claims, 2 Drawing Figures

CONTROL CIRCUIT FOR USE WITH AIR-DIVERTER VALVE OF INTERNAL COMBUSTION ENGINE

BACKGROUND

This invention relates to automatic pollution control systems for automotive vehicles, and more particularly to automatic devices adapted to reduce the amount of toxic pollutants in the exhaust by allowing controlled amounts of supplemental air, commonly known as "secondary air", to be mixed with the exhaust gases and to react therewith.

During normal operation of an internal combustion engine the reaction of the fuel and air produces a number of gases, particularly carbon-, hydrogen-, nitrogen-, and sulfur-based compounds. Considerable heating of the exhaust manifold occurs as a result of conduction of the heat contained in the exhaust gas to the metal surfaces thereof. It has been found that some of the exhaust gases from an internal combustion engine can be burned further by the introduction of controlled quantities of air under certain conditions, thereby either reducing the net pollutants emanating from the engine, or else rendering such pollutants less toxic, as for example, converting poisonous carbon monoxide to harmless carbon dioxide and water vapor.

The additional heat generated by the burning process results in increased temperatures in the manifolds. While this has been found to be not objectionable at low and mid-range engine speeds, excessive heat tends to occur if the engine speed increases above a certain point. Empirically it has been determined that a safe temperature can be maintained at engine speeds of around 3000 r.p.m. or less; above this figure it is necessary to divert the secondary air away from the manifolds, and either route it back into the air strainer or directly to the muffler. While this diverting inhibits the desired "burning" mentioned above, it prevents undesirable overheating of and damage to the manifolds. If allowed to continue at high engine speeds, the "burning" process could cause permanent damage to the exhaust system.

It has been proposed that one or more solenoid-operated air-diverter valves be employed, to provide communication with the source of the secondary air and the manifolds, such valves being adapted to be opened by the solenoids when the vehicle is initially started, and remain open when the engine is run at speeds below a predetermined or given speed. In the event that speed is increased, the solenoids following a suitable delay could be de-energized, thus closing the valves and eliminating the overheating.

SUMMARY

The problems involved with actuating diverter valves of the kind above set forth are largely obviated by the present invention which has for one object the provision of a novel and improved electronic control circuit for actuating an air-diverter valve, which is both simple in construction and reliable in operation over extended periods of use and under a wide variety of operating conditions.

A related object of the invention is to provide an improved electronic control circuit as above set forth, wherein carefully, precisely-timed intervals are employed in order to control the opening and closing of the air-diverter valve or valves, such that maximum utilization is made of the exhaust burning capability of the secondary air, with but little or no risk of overheating of the exhaust system, and no hazard posed to the operator or passengers of the vehicle in the event of a circuit failure.

Still another object of the invention is to provide an improved control circuit as above characterized, which is capable of opening the air-diverter valve or valves after a suitable, preselected time delay if the engine speed exceeds a given figure for a continuous period, and which can sense momentary decreases in engine speed and render a safe decision as to whether to alter the opening-closing pattern or to allow it to remain the same as it was prior to the momentary decrease.

A still further object of the invention is to provide an improved electronic control circuit as outlined above, wherein an indicator is included to assist the operator of the vehicle in determining proper functioning of the circuit, and to alert him in the event that a circuit or system malfunction occurs.

Yet another object of the invention is to provide an improved electronic control circuit of the kind indicated, wherein the diverter valve or valves and associated circuit are essentially completely fail-safe in the event of a malfunction. The arrangement is such that the most likely modes of failure result in a mere increase in exhaust pollution, rather than creating a possible hazard to personnel in the vehicle from overheating of the engine or the exhaust manifolds, or of other parts of the system, etc., or any other type of occurrence which might result in a fire or safety hazard.

Yet another object of the invention is to provide an improved electronic control system as above set forth, wherein the integrity of the indicator which is provided to alert the operator of a possible malfunction in the control circuit is verified each time that the vehicle is operated, by virtue of its being at least momentarily energized when the vehicle's ignition circuit is initially turned on.

A still further object of the invention is to provide an improved electronic control circuit as above characterized, wherein a failure in the solid state switching circuit for the diverter valve solenoids is made apparent to the operator. Included in the possible failure modes are an open-circuited solenoid coil in one or both of the the diverter valves, a short-circuited transistor switch, or an open-circuited transistor switch.

Another object of the invention is to provide an improved electronic control circuit of the kind indicated, wherein maximum utilization is made of spike-suppression components and spike-resistant circuit arrangements, so that there is greatly minimized the possibility of inadvertent damage to the circuit from stray signals appearing in the vehicle's electrical system. This latter consideration is extremely important in present day vehicles, where there exists a large number of electric motors and other accessories that are capable of producing spikes or transients on the supply lines, having magnitudes of up to forty, fifty or more volts.

The above objects are accomplished by the provision of an electronic control circuit for actuating one or more air-diverter valves connected with the exhaust system of an internal combustion engine to supply secondary air thereto, comprising means responsive to engine speed, for operating the air-diverter valve or valves toward a closing position after a predetermined time interval has elapsed with the engine running above a given speed, and additional means responsive to engine speed, for rendering inoperative the first mentioned means if there has elapsed a second time interval, shorter than said first predetermined time interval, during which the engine has run continuously at a speed lower than said given speed, all to the end that exhaust pollutants are reduced without incurring excessive heating of the exhaust system.

The objects are further accomplished by an electronic control circuit for actuating an air-diverter valve or valves connected with the exhaust system of an internal combustion engine to supply air thereto, comprising an electronic timer means adapted to provide a first, finite operating time interval, means responsive to a predetermined engine speed, for automatically activating the timer means, means connected with the output of the timer means, for operating the air-diverter valve or valves toward a closing position after the expiration of the first, finite operating time interval, a second electronic timer means also responsive to engine speed, adapted to provide a second, finite operating time interval, means for starting the second timer means after the attainment of the predetermined engine speed and a subsequent drop therebelow, and means controlled by the second timer means, for inactivating the first timer means only after the second, finite operating time interval has elapsed. The second, finite operating time interval is shorter than the first finite operating time interval, to the end that exhaust pollutants are reduced without incurring excessive heating of the exhaust system.

The objects are still further accomplished by an electronic control circuit for actuating an air-diverter valve or valves connected with the exhaust system of an internal combustion engine to supply air thereto, comprising an electronic timer means adapted to provide a first, finite operating time interval, means responsive to a predetermined engine speed for automatically activating the timer means, means connected with the output of the timer means for operating the air-diverter valve or valves toward a closing position after the expiration of the first operating time interval, a second electronic timer means which is also responsive to engine speed and is adapted to provide a second, finite operating time interval, means for starting the second timer means after the attainment of the predetermined engine speed and a subsequent drop therebelow, and means controlled by the second timer means for re-setting the first timer means only after the second, finite operating time interval has elapsed. The second, finite operating time interval is shorter than the first finite operating time interval, all to the end that exhaust pollutants are reduced without incurring excessive heating of the exhaust system.

Other features and advantages will hereinafter appear.

Figure 2:
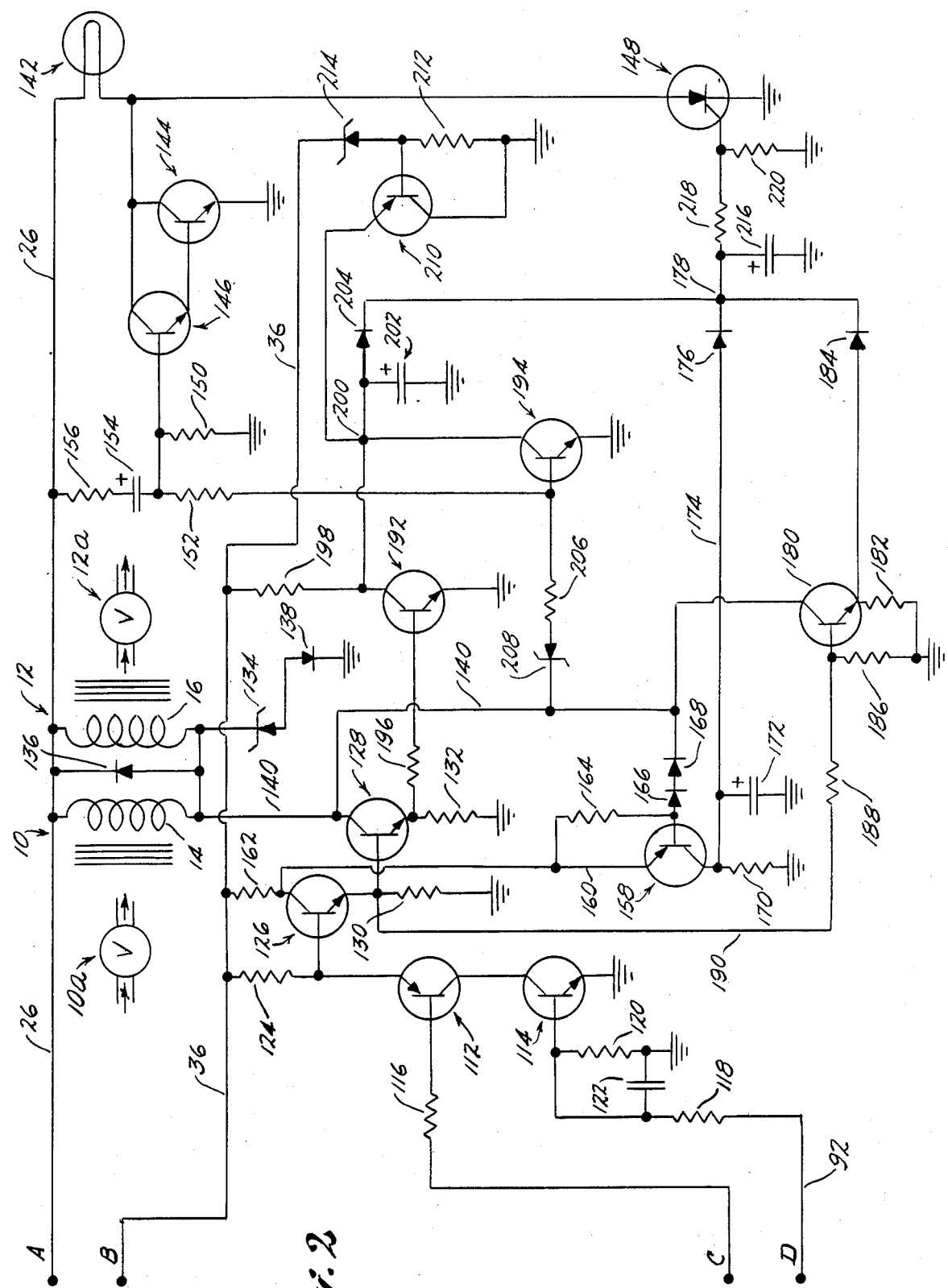

In the accompanying drawings, illustrating a preferred embodiment of the invention:

FIGS. 1 and 2 are respective portions of a schematic circuit diagram of the present invention. The terminals in FIG. 1 labelled A, B, C and D are intended to be permanently connected to the correspondingly-labelled terminals in FIG. 2, so that the two figures constitute a composite single schematic of the entire circuit.

Referring to FIGS. 1 and 2 and in accordance with the present invention there is illustrated a novel and improved system for controlling the mixing of secondary air with hot exhaust gases in the exhaust manifold of an automotive vehicle, thereby reducing the resultant pollutants from the engine while at the same time insuring that excessive temperatures in the vehicle's exhaust system are not experienced. The system incorporates either one or two solenoid-actuated air-diverter valves, two solenoids therefor being diagrammatically illustrated in FIG. 2 and designated by the numerals 10 and 12. They are of the type comprising d.c. solenoid coils 14, 16 associated with magnetic actuators as shown. The solenoid coils 14, 16 each have a resistance of approximately 28 ohms. The air-diverter valves indicated 10a and 12a, actuated by the solenoids 10, 12, have inlets, and outlets connected with the respective exhaust manifolds (not shown). When the vehicle is idle, the solenoids are de-energized and the valves are closed.

Further, in accordance with the invention, means are provided for opening the air-diverter valves when the engine ignition switch is initially closed, and while the engine is operative and running below a predetermined speed, and for closing the valves if a predetermined time interval elapses during which the engine has run at rates which are at least above said predetermined speed. Additional means are provided for rendering inoperative the first mentioned means, if prior to expiration of the first time interval, there has elapsed a second time interval, shorter than the first, during which the engine has run continuously at rates which are lower than the predetermined speed.

FIGS. 1 and 2 constitute a composite essentially complete schematic diagram of the present control circuit adapted to accomplish the above described operation. The showing of FIG. 1, as already mentioned above, contains four terminals labelled A, B, C and D, which are intended to be permanently connected to the correspondingly labelled terminals of FIG. 2. In FIG. 1, the vehicle's battery is indicated 18, with the ignition switch 20 having a contact 22 which is electrically cold until the ignition switch is turned on, all in the usual manner. A filter capacitor 24 is provided to intercept any spikes or transients which might occur on the line 26 that is connected to the ignition switch. From line 26 a diode 28 connects to the collector of a transistor 30, and in addition through a resistor 32 to the junction of the transistor's base and cathode of a Zener diode 34. The other terminal of the Zener diode 34 is connected to the vehicle's electrical ground. The transistor 30 acts somewhat like a pass transistor in an electronic voltage regulator, and provides a voltage on the line or bus 36 extending from its emitter. The Zener diode 34 is normally not conducting since its voltage rating is around 18 volts; it will, however, sense an incoming surge from the ignition circuit, clamp at its rated 18 volts, and with the transistor 30, function to isolate the surge from the line or bus 36. This latter bus is nominally at a voltage just under that appearing on the collector of transistor 30, that is, around 10 or 11 volts d.c., and supplies this voltage to a number of components, to be described below.

Referring again to FIG. 1, there is illustrated an integrated circuit frequency-to-voltage converter so arranged as to provide either a digital high or low level output, depending on whether the input frequency is above or below a predetermined setting. The converter is designated 38, and electrical power is supplied to it through a line 40 connected to its terminal #5. Its terminal #8 is grounded, as shown. Associated with the unit are resistors 42, 44 and 46 and an RC network 48, 50. Also provided are a variable resistor 52 constituting a threshold adjustment, and a capacitor 54.

The input of the frequency-to-voltage converter 38 is terminal #1. This is connected through a coupling capacitor 56 to a limiter resistor 58, the other side of which is connected to a terminal 60 that extends to a source of alternating voltage or pulses that correspond to engine speed. Typically this connection would be derived from either a tachometer, the electronic ignition of the vehicle, or other voltage source reflecting engine speed. The Zener diode 62 limits the voltage reaching terminal #1, and capacitor 64 constitutes a by-pass capacitor to facilitate proper triggering of the converter 38.

Output from the converter 38 is taken from terminal #4, which extends to a line designated 66. This in turn is joined to the base and emitter of a transistor 68 which is connected as a diode, through a resistor 70 to the input 72 of an integrated circuit operational amplifier 74. Terminal #7 thereof is connected to the positive line 36 as shown, and terminal #4 is grounded. Terminals #2 and #3 are respectively the inverting and non-inverting inputs of the amplifier 74. Extending from the inverting input terminal #2 is an RC timing network 76, 78, the operation of which will be explained below. The non-inverting input, terminal #3, obtains a fixed bias voltage from a resistive divider 80, 82. Terminals #1, #8 and #5 are unconnected, and output from the device is taken from terminal #6. The output is fed to a switching transistor 84 through a resistor 86. The emitter of the transistor 84 extends to the positive line 36 as shown. The base is connected to the line 36 through a bias resistor 88, and the collector extends to a load resistor 90, the other side of which is grounded, as shown.

The output line 92 from transistor 84 is connected through a resistor 94 to the base of another switching transistor 96, having its emitter grounded. A load resistor 98 extends to the positive line 36, and the output from the collector is fed to an integrated circuit timer, through a coupling capacitor 100. A resistor 102 extends to line 36. The timer is indicated by the numeral 104, and its triggering input is terminal #2.

Terminal #8 of the timer 104 is supplied with positive voltage by line 36, and terminal #1 is grounded. Connected to terminals #6 and #7 is an RC network 106, 108, which determines the nature of the output signal on terminal #3, as will be explained. Terminal #4 is a re-set for the timer 104, and this extends to line 92 which is joined to the collector of transistor 84.

Referring now to FIG. 2, there are illustrated two series-connected transistor switches 112 and 114. Switch 112 is driven through a resistor 116 by the output from timer 104, terminal #3 thereof. Similarly, switch 114 is driven by the signal derived from transistor 84 and appearing on line 92. This signal is coupled through a resistor 118, to a resistor 120 and capacitor 122, and to the base of the transistor 114. Resistor 124 biases transistor 126 to an on condition in the absence of emitter current flowing into transistor 112. Transistors 112 and 114 are employed to selectively control transistors 126 and 128, the latter transistor being directly connected with the solenoids 14 and 16 of the air-diverter valves. Transistors 126 and 128 have resistors 130, 132 respectively connected from their emitters to ground as shown, and transistor 128 operates the valves 10a, 12a in the desired manner, as will be described. The transistor 128 thus constitutes a solid state driver for the solenoids.

A Zener diode 134 protects the collector of transistor 128 against being subjected to excessive voltages, such as spikes or transients. Diode 136 suppresses induced voltages in the solenoids 14, 16, resulting from sudden de-energization thereof. Diode 138 constitutes reverse polarity protection for the Zener diode 134 in the event that the solenoids 14 or 16 are installed incorrectly. The junction of the solenoids 14 and 16 with the collector of the transistor 128 is indicated by the numeral 140.

Further, by the present invention a number of self-diagnostic circuits are provided in order to verify proper operation of the various parts of the control circuitry and to provide a visual indication to the operator of the vehicle in the event of a malfunction in the system. The indicator preferably takes the form of an incandescent lamp 142 having one lead connected to the line 26, this being the same line through which the solenoids 14 and 16 are supplied. This line is subject to spikes or transients produced by other electrical equipment in the vehicle. The other lamp lead is connected to the collectors of a Darlington pair 144, 146, and to the anode terminal of an SCR 148. The cathode terminal of the SCR is grounded, as shown. The emitter of transistor 144 is grounded, and the emitter of transistor 146 is connected to the base of the transistor 144. The base of transistor 146 is connected to a resistor 150 as shown, and in addition to the junction of an additional resistor 152 and a capacitor 154. The other lead of the capacitor is connected through a resistor 156 to the line 26.

Possible failure modes which are intended to be monitored include the following: Permanent short-circuiting of the transistor 128; permanent open-circuiting of the transistor 128; permanent open-circuiting of either or both of the solenoid coils 14 and 16; and failure of the lamp 142.

In checking for a short-circuited transistor 128, a transistor 158 is provided, having its emitter connected via line 160 to the collector of transistor 126. The collector of this transistor has a resistor 162 extending to the line 36. Another resistor 164 is connected between the base and emitter of the transistor 158. A pair of diodes 166, 168 extend from the base of transistor 158 to line 140, which is the collector of transistor 128. The collector load for the transistor 158 comprises resistor 170. A capacitor 172 is also provided, to reduce transients on the line 174, which could otherwise lead to a false indication of a malfunction. The line 174 from the collector of transistor 158 extends through an isolation diode 176 to a junction point 178 that is associated with triggering the SCR 148.

A second circuit is provided to check for a permanent open-circuit condition of transistor 128, the circuit including a transistor 180 having its collector connected to line 140, its emitter extending to a resistor 182 to ground and also through an isolation diode 184 to the junction 178. The base has a resistor 186 going to ground, and an additional resistor 188 leading to a line 190 connected to the emitter of transistor 126.

Another circuit comprising transistors 192 and 194 is arranged to monitor whether the solenoids 14 and 16 are in proper operating condition or if a possible open circuit has occurred in one or both of the units. The base of transistor 192 is connected through a resistor 196 to the emitter of the transistor 128. The emitter of transistor 192 is grounded, and the collector extends through a resistor 198 to the supply line 36. The collectors of transistors 192 and 194 are both tied together, forming a junction 200, from which a capacitor 202 extends to ground. Also from junction 200 there is another isolation diode 204 leading to the junction 178. The base of the transistor 194 is connected to the resistor 152, and also to another resistor 206, the other end of which leads to a Zener diode 208 that runs to the line 140.

Another part of the present circuit functions to prevent false indications during momentary drops in the system voltage, as can occur during cranking of the engine. Connected to the junction 200 is the emitter of a transistor 210. Its base has a resistor 212 to ground, and a Zener diode 214 that is connected to the positive supply line 36.

From the junction 178 of the diodes 204, 176 and 184, there is a by-pass capacitor 216, a series resistor 218 extending to the gate of the SCR 148, and a biasing resistor 220 for the SCR, leading to ground.

The operation of the control circuit of the invention will now be described. Initially the discussion will relate to the circuitry of FIG. 1 and that portion of the circuitry of FIG. 2 that includes the solenoids 14, 16, the transistors 126 and 128, and the transistors 112 and 114. The components so designated constitute the engine-speed sensing and valve control portion of the circuit, as opposed to the remainder of FIG. 2, which includes the diagnostic and monitor circuitry.

Assuming for purposes of explanation, that two diverter valves are employed, one for each exhaust manifold, the solenoids 14, 16 are initially energized and the associated diverter valves 10a and 12a opened at the time that the ignition switch is turned on. After the engine has started, the open valves permit what is known as "secondary air" to be mixed with unburned gases in the manifolds; further burning can occur whereby the nature of the pollutants can be altered, and the amount of toxic pollutants reduced. The above process generates a certain amount of additional heat in the manifolds, above that which would occur from mere conduction of the exhaust gases. The additional heat becomes significant at higher engine speeds, and accordingly it has been found necessary to close off the valves 10a and 12a (i.e. de-energize the solenoids 14, 16) at certain speeds above several thousand revolutions per minute (typically 3000 r.p.m.), but only after sustained operation above that figure over a predetermined time interval, typically 90 seconds. In the circuit of the invention the engine speed is sensed by the frequency-to-voltage converter 38, the output of which is employed to enable or initiate a timer 104, which in turn de-energizes the solenoids 14, 16 after the 90 second interval has elapsed, thereby closing the air-diverter valves and preventing overheating of the exhaust manifolds. The timer 104 is both re-set and triggered on for the first time as soon as engine speed reaches 3000 r.p.m. If the engine speed remains above this figure the timer will run its course, and this will result in closing of the air-diverter valves after perhaps 90 seconds or so.

Also, by the invention provision is made to disable and reset the timer 104 after it has begun running, if engine speed drops below 3000 r.p.m. and stays below this figure for another, or second and shorter time interval, typically 20 seconds. Such an occurence would arise if the vehicle sped up, and then suddenly the operator let up on the accelerator. If, following the 3000 r.p.m. advance, there occurs a 20 second interval during all portions of which the speed is below this figure, the timer 104 will be disabled and re-set, so as to keep the valves 10a and 12a open and maintain overall pollutants at a minimum. However, if the interval of reduced speed is less than 20 seconds, no re-setting or disabling of the timer 104 occurs. Thus, the amplifier 74 and associated circuitry can be thought of as a holding circuit which prevents interruption of the timer 104 in the event of momentary decreases in engine speed, that is, decreases which last less than 20 seconds. In the absence of some type of holding circuit, a situation could develop where the engine was running above 3000 r.p.m., with frequent interruptions to speeds below this value, as would occur in down-shifting, required momentary slowing down of the vehicle, etc. If the circuit were so arranged that each of these interruptions stopped and re-set the timer 104, it is possible that the solenoids 14, 16 would almost never close even though the engine speed might average over 3000 r.p.m. for most of the time. Overheating of the exhaust manifold would inevitably result in such a circumstance. The holding circuit thus circumvents this possibility.

As pointed out above, in FIGS. 1 and 2, the terminals labelled A, B, C and D are intended to be connected to one another, respectively.

In operation, referring to FIG. 1, when the ignition switch 20 is initially closed, the 12 volt battery voltage is applied, through diode 28, to the collector of transistor 30. Since the Zener diode 34 is rated at a somewhat higher voltage, typically 18 volts, transistor 30 merely conducts as a result of base drive through resistor 32; due to a small drop through the diode and transistor, there appears on line 36 a voltage somewhat less than 11 volts. This voltage is immediately applied to terminal #5 of the frequency-to-voltage converter 38, to terminal #8 of the timer 104, terminal #7 of the amplifier 74, and to resistors 98, 102, 82, the emitter of transistor 84, resistor 124, and resistor 162. Initially, transistors 84 and 96 are off, the output from terminal #4 of the frequency-to-voltage converter 38 is low, and timer 104 is not running. With transistor 114 off, current can flow through resistor 124 to the base of transistor 126, which in turn drives the base of transistor 128, rendering the latter conducting. This results in immediate energization of the solenoids 14 and 16, and opening of the air-diverter valves occurs. The valves remain open as the vehicle's engine is started by the operator.

Following this, a pulse signal representing engine speed appears on terminal 60, and is applied through resistor 58 and capacitor 56 to the frequency-to-voltage converter 38. The converter provides a low d.c. level on line 66 when the input frequency is below a certain point, and a high d.c. level on this line when the frequency exceeds that point. The resistor 52 is employed to adjust the engine speed threshold at which the converter output shifts. In the present case, the desired shift would occur at 3000 r.p.m. Assuming engine speed is lower than this figure, voltage on line 66 would be low, and the collector of transistor 68 would be at ground, because of resistor 76. Integrated circuit amplifier 74 would assume a high level on its output terminal #6, since the inverting input terminal #2 is at a lower level than its non-inverting terminal #3. Transistor 84 would be off, and line 92 would be at ground. Transistor 96 would also be off, and terminal #2 of timer 104 would be at a high d.c. level. The re-set terminal, #4, would be at ground.

Under these circumstances, transistor 114, FIG. 2, would be off, and even though transistor 112 would be on due to a low d.c. level from output terminal #3 of timer 104, current would flow from line 36 through resistor 124 and into transistor 126. This would in turn cause base current to flow in transistor 128, thereby energizing the solenoids 14 and 16, and maintaining the valves open.

If the engine speed rises above the 3000 r.p.m. figure, the frequency-to-voltage converter 38 will provide a high d.c. level on its output line or terminal #4 (also referred to as line 66), causing several things to happen. The transistor 68 is rendered conductive by virtue of its base-collector junction being forward biased, this being the reverse mode of operation from that conventionally employed. As a result, current flowing through the junction and resistor 70 rapidly charges the capacitor 78, which in turn causes amplifier 74 to assume a low d.c. level on terminal #6 thereof, this in turn rendering transistor 84 conductive. Line 92 now assumes a high d.c. level, which is applied to terminal #4 of the timer 104, this functioning to reset the same to zero. Simultaneously transistor 96 is rendered conductive. Its collector suddenly drops in potential, which drop is coupled through capacitor 100 to terminal #2 of the timer. This is the triggering terminal, and the resultant voltage appearing on this terminal is in the nature of a negative-going spike. The application of the triggering voltage to terminal #2 enables or initiates the timer 104. The output therefrom, terminal #3, assumes a high d.c. level, which is applied through resistor 116 to the base of transistor 112, rendering it non-conductive. The positive d.c. level on line 92 is applied to transistor 114, rendering it conductive after a short delay. However, the arrangement is such that transistor 112 ceases to conduct prior to transistor 114 beginning to conduct. As a result, there is no interruption in base current flow to transistor 126 through resistor 124, and therefore the solenoids 14 and 16 remain energized.

Following this there are several possibilities. First, the engine r.p.m. can remain above 3000 for a continuous and uninterrupted interval of over 90 seconds, in which case the timer 104 will have run its course, and the signal on terminal #3 thereof will switch to a low d.c. level, rendering transistor 112 conductive. Since transistor 114 is still conducting, a low resistance path to ground is provided to the base circuit of transistor 126, and it is turned off. This then turns off transistor 128, and de-energizes the solenoids 14 and 16, closing the air-diverter valves and preventing the occurence of possible overheating. The valves will remain closed as long as the 3000 r.p.m. figure is exceeded. When the engine speed is eventually reduced below this figure, terminal #4 of the converter 38 will immediately assume a low d.c. level, and the collector of transistor 68 will be isolated from line 66. Capacitor 78 is still charged, however, and its discharge rate is determined by the time constant formed by it and the parallel combination of resistor 76 and the input resistance at the inverting input terminal #2 of amplifier 74. This time constant can be relatively long, such that amplifier 74 will remain in its present state for 20 seconds or so, that is, its output on terminal #6 will be low, keeping transistor 84 on, and transistor 114 also on. Since both transistors 112 and 114 are conducting, transistors 126 and 128 will be off, and solenoids 14, 16 will remain de-energized. Eventually, after the 20 second interval elapses, the capacitor 78 discharges sufficiently to cause terminal #6 of amplifier 74 to assume a high d.c. level output, shutting off transistor 84, and thereby shutting off transistor 114. Since the path from the base of transistor 126 to ground has now been removed, transistors 126 and 128 conduct, and the solenoids 14 and 16 become energized once again. This presumes that the engine speed has remained below 3000 r.p.m. throughout the period immediately following the initial reduction in engine speed.

As an alternate possibility, the engine speed can be increased to over 3000 r.p.m. for an interval of less than 90 seconds, and then reduced to less than 3000 r.p.m. permanently. In such a case, the solenoids 14 and 16 would remain energized. As soon as the 3000 r.p.m. figure was reached, the frequency-to-voltage converter 38 would apply a high level signal to the line 72 through transistor 68 and effect triggering of the timer, terminal #2, as previously described. After the engine speed decreased, line 66 would immediately drop to a low level, isolating the collector of transistor 68 from line 66, and enabling capacitor 78 to discharge through resistor 76 and the inverting input terminal #2 of the amplifier 74. After 20 seconds or so of operation at the decreased engine r.p.m., amplifier 74 would assume a high output level, thus turning off transistors 84 and 114. Since transistor 112 was already off, base current continues to flow through resistor 124, maintaining transistors 126 and 128 conducting, and the solenoids 14, 16 remain energized, corresponding to open air-diverter valves.

As a third possibility, the engine speed might be increased to over 3000 r.p.m. for an interval of less than 90 seconds, and then reduced to less than 3000 r.p.m. for several seconds, such as where the operator decelerated momentarily, and then increased again to more than 3000. If the second time interval, i.e. that period when the speed was below 3000 r.p.m. was less than a predetermined figure, say under 20 seconds, then the timer 104 would run its course and the solenoids would remain energized until after the timer expired, following its initial triggering. Assuming that at the expiration the speed was above 3000 r.p.m., the solenoids 14 and 16 would become de-energized, and the valves would close. On the other hand, if the second time interval was more than the predetermined figure, that is, more than 20 seconds, and then the engine speed was increased to over 3000 r.p.m., the amplifier 74 will have switched transistor 84 off after the 20 seconds has elapsed, causing the timer 104 to re-set. When the speed rises again, the amplifier 74 will switch transistor 84 back on. This re-triggers the timer 104, terminal #2. Accordingly, a full timing cycle as determined by the time constants associated with timer 104 will occur, prior to de-energizing of the solenoids 14, 16.

The operation of the indicator lamp 142 will now be described. As shown, the lamp can be energized by either the transistor 144, or alternately by the SCR 148. The operativeness of the lamp is automatically verified when the ignition switch 20 is initially closed. At such time, a positive voltage is suddenly applied to line 26, and with capacitor 154 initially uncharged, a portion of the applied voltage appears at the base of transistor 146, turning it on as well as turning on the successive stage 144. The capacitor 154 charges after a short time interval, typically from one to four seconds, and following this period, the lamp 142 becomes extinguished because there is no further source of base current for transistor 146. Thus upon turning on the ignition, there occurs a momentary flash of the lamp 142 which provides the driver of the vehicle with an indication that the unit is not burned out. Failure to see a momentary flash could indicate such a burn out, or possibly point to another problem in the circuit.

The lamp 142 is preferably of the incandescent type, characterized by a filament which has a very low resistance when cold, typically on the order of several ohms, and which increases significantly when heated. Such filaments are generally constituted of tungsten, which exhibits this positive temperature coefficient characteristic. By the present invention, the arrangement of the lamp, the transistors 144 and 146, and the capacitor 154, is such that the lamp is generally in parallel with the remainder of the control circuit in FIGS. 1 and 2 when the transistors 144 and 146 are conducting. In the event that the circuit comprising line 26 (which is the ignition circuit, with the ignition switch closed) experiences a positive voltage spike, the latter will, if large enough, be coupled through the capacitor 154 and supply base current to transistor 146. This will in turn cause transistor 144 to immediately turn on, effectively placing the low resistance filament of the lamp 142 in parallel with the diode 28 and components of the circuit to the right of the diode 28 in FIGS. 1 and 2. Since the lamp is normally off, presumably when such a spike arrives the lamp filament will be in a relatively cold condition, and it has been found that the very low resistance represented thereby is extremely effective in suppressing or reducing the magnitude of the spike. Unless its size is unusually large, or perhaps takes the form of a relatively long pulse, it will at most produce a momentary flashing of the bulb 142. In all likelihood the bulb would absorb the spike. In the event that bulb burn-out were to occur, however, it is believed that some degree of protection would still be afforded the circuit to the right of the diode 28 in FIG. 1.

Also by the invention, means are provided for checking the integrity of the windings of the solenoids 14, 16 for continuity, and for determining failure of the transistor 128 which handles the relatively heavy switching current for the solenoids 14 and 16. Such failures are reflected by an increase in the voltage on junction 178, resulting in triggering of the SCR 148 and permanent illumination of the lamp 142.

In determining the integrity of the windings of the solenoids 14, 16, the value of the resistor 132 is selected to provide a predetermined, fixed voltage drop across it when the total rated solenoid currents are flowing through it. The voltage is sufficient to bias the transistor 192 into conduction, keeping the voltage on the collector of the transistor 192 at a low d.c. level. The isolation diode 204 is thus not forward biased, and junction 178 receives no energy therethrough. If a discontinuity develops in one or both of the coils of the solenoids 14, 16, the voltage applied to the base of transistor 192 is insufficient to maintain the transistor 192 conducting. The collector voltage thereof rises somewhat (transistor 194 is off), and diode 204 becomes sufficiently forward biased to trigger the SCR through the diode 204 and resistor 218. That is, current from line 36 flows through resistor 198 and to the diode 204 in the absence of conduction of transistor 192. However, under normal operation, transistor 194 conducts (due to base drive through Zener diode 208 and resistor 206) when the solenoids are deenergized, so that there is no forward bias on diode 204, which could result in a false alarm.

In the event that the transistor 128 fails by permanently open-circuiting, line 140 would assume a high d.c. level, and if the base voltage applied to transistor 128 were of a magnitude sufficient to render the transistor 128 normally conducting, transistor 180 would receive sufficient base drive through resistor 188 to render it conducting. Consequently the voltage across resistor 182 would be sufficient to forward bias diode 184 and gate the SCR 148 on, through the resistor 218.

A shorted transistor 128 would be detected as follows: If transistor 126 were receiving no base drive, its collector, line 160 would assume a high d.c. level. On the other hand, the collector of shorted transistor 128 would be near ground potential, since the resistor 132 is only several ohms, at most. The diodes 166 and 168 would thus be forward biased, sinking the base current from transistor 158. The collector of the latter, line 174, would thus assume a high level, sufficient to forward bias diode 176 and gate the SCR 148 on, through the resistor 218.

The diodes 204, 176 and 184 thus act as OR gates feeding the gate of the SCR 148. That is, when any one of the diodes conducts as a result of an increase in voltage on its anode, the SCR 148 fires and remains on, causing a continuous illumination of the lamp 142. As stated above, this continuous illumination indicates a problem with the circuit, either an open or shorted transistor 128, open solenoid winding 14 or 16, or possibly a malfunction in yet another area. Once the SCR 148 fires, the lamp 142 will remain illuminated continuously until the ignition switch is opened. The next time the ignition switch is turned on, the SCR 148 will again fire, illuminating lamp 142 permanently and reminding the operator that a malfunction still exists.

Also, by the invention means are provided for rendering the indicator 142 momentarily inoperative while the engine is being initially cranked or started, such means comprising the transistor 210, Zener diode 214 and resistor 212. Under certain conditions, the voltage in the vehicle's electrical system can drop to as low as 7 or 8 volts d.c., usually resulting from the load effect of the starter motor, possibly aggravated by a weak battery, cold weather, etc. The voltage rating of the Zener diode is so selected that if the voltage on line 36 drops below 7 or 8 volts, transistor 210 will conduct, maintaining the voltage at junction 200 near ground. This will circumvent the possibility of the diode 204 being forward biased through resistor 198 in the event that transistor 192 misinterprets the low voltage on its base as a failure, and attempts to trigger the SCR 148 through the diode 204. Such an occurence would tend to defeat the monitoring function of lamp 142, since with the present arrangement, once the SCR is triggered, even if done so inadvertently or momentarily, the lamp 142 will remain illuminated until such time as the ignition switch is turned off, as pointed out above.

The following component values have been found to provide satisfactory performance in the circuit of FIGS. 1 and 2, and are listed herebelow. They are to be considered exemplary, and not limiting, since deviations from those values indicated could provide equally good results.

Integrated circuit 38 can be of a type known by the commercial designation 2917, manufactured by National Semiconductor and others. Timer 104 is a type 555, also made by National Semiconductor and others. Amplifier 74 is a type 741, same manufacturer.

The other components associated with the frequency-to-voltage converter 38 have the following values: Resistors 42 and 44 are 10K ohms. Resistor 58 is 47K ohms. Resistor 48 is 150K ohms, and resistor 46 is 470 ohms. Resistor 52 is 1000 ohms. Capacitors 50, 54 and 64 are respectively 4.7 mfd., 0.015 mfd., and 0.022 mfd. Capacitor 56 is also 0.022 mfd. Zener diode 62 is a type 1N758, rated at 10 volts.

Transistors 96, 114, 126, 192 and 194 can be general purpose, small signal NPN types; all five can be conveniently contained in a 14 pin dual-in-line integrated circuit package known by the designation 3086.

Referring to the upper left corner of FIG. 1, the transistor 30 is a type TIP110. Diode 28 is a 1N4001. Zener diode 34 is a type 1N4746, having a voltage rating of 18 volts. Resistor 32 is 220 ohms, and capacitor 24 is 4.7 mfd. Associated with transistor 96 are resistors 94 and 98, 2000 ohms and 4700 ohms, respectively. The capacitor 100 is 4.7 mfd. Resistor 102 is 10K ohms. Resistor 106 is 1.6 megohms, and capacitors 108 and 110 are 47 mfd. and 0.01 mfd. respectively. Transistor 68 is a type 2N3903, and resistor 70 is 1000 ohms. Resistor 76 is 4.3 megohms, and capacitor 78 is 4.7 mfd. Resistors 80 and 82 are 2000 ohms and 12K ohms respectively. Transistor 84 is a type 2N3905. Resistors 86 and 88 are each 1000 ohms. Resistor 90 is 330 ohms.

Referring to FIG. 2, transistor 112 is a type 2N3905. Resistors 116 and 118 are each 2000 ohms, and resistor 120 is 1000 ohms. Capacitor 122 is 47 mfd. Resistors 124, 130 and 162 are 2000 ohms, 470 ohms and 330 ohms respectively. Transistor 128 is a type TIP120. Resistor 132 is 2.4 ohms, and resistor 196 is 10 ohms. Diode 136 is a 1N4004, and Zener diode 134 is a type 1N4753, having a rating of 36 volts. Diode 138 is a type 1N4001.

Referring to the remainder of FIG. 2, transistor 158 is a type 2N3905. Resistors 164 and 170 are respectively 1000 ohms and 2000 ohms. Capacitor 172 is 47 mfd. Diodes 166 and 168 are type 1N914. Resistors 182 and 186 are both 2000 ohms, and resistor 188 is 1000 ohms. Diodes 204, 176 and 184 are all type 1N914.

Resistor 198 is 680 ohms. Resistor 206 is 470 ohms, and Zener diode 208 is a type 1N4370, having a rating of 2.4 volts. Resistors 150, 152 and 156 are 3300 ohms, 2200 ohms, and 1000 ohms respectively. Capacitor 154 is 220 mfd. Capacitor 202 is 47 mfd. Transistors 144 and 146 are types 2N4400 and 2N3903 respectively. Transistor 210 is a 2N3905. Resistor 212 is 220 ohms, and Zener diode 214 is a type 1N754A having a rating of 6.8 volts.

SCR 148 is a type 2N5061. Resistors 218 and 220 are both 150 ohms, and capacitor 216 is 47 mfd.

From the above it can be seen that I have provided a novel control circuit for air-diverter valves in an automobile exhaust system, the circuit being straightforward in its construction, and reliable in operation under a wide variety of conditions and over extended periods of use. The components are of a type which are readily available, and it is believed that the illustrated circuit could be constructed and operated successfully by a skilled technician, employing the component types and values supplied.

The circuit incorporates appropriate time delays following the detection of predetermined, given engine speeds, and effects operation of the air-diverter valves according to a plan by which the maximum reduction in pollution is realizeable without exposing the engine or the personnel in the vehicle to risk from heat or fire. Suitable diagnostic features are incorporated in the circuit to provide indications to the operator that the circuit is functioning properly, and that the indicator itself is operative.

The device is thus seen to represent a distinct advance and improvement in the technology of pollution reduction systems for automotive vehicles.

Each and every one of the appended claims defines an aspect of the invention which is distinct from all others, and accordingly each claim is to be treated in this manner when examined in the light of the prior art devices in any determination of novelty or validity.

Variations and modifications are possible without departing from the spirit of the claims.

What is claimed is:

1. An electronic control circuit for actuating an air-diverter valve connected with the exhaust system of an internal combustion engine to supply air thereto, comprising in combination:
   (a) means responsive to engine speed, for operating said air diverter valve toward its closing position if a predetermined time interval has elapsed with the engine running above a given speed, and
   (b) means responsive to engine speed, for rendering inoperative the first mentioned means if there has elapsed a second time interval, shorter than said first predetermined time interval, during which the engine has run continuously at a speed lower than said given speed, all to the end that exhaust pollutants are reduced without incurring excessive heating of the exhaust system.

2. The invention as defined in claim 1, wherein:
   (a) said operating means comprises a frequency-to-voltage converter, having an input adapted to monitor engine speed,
   (b) a timer,
   (c) means connected with the output of the frequency-to-voltage converter and the input of the timer, adapted to re-set the latter and render it operative when the engine speed exceeds said given speed,
   (d) said air-diverter valve having a solenoid operator, and
   (e) said operating means further comprising a solid state driver device connected with the solenoid operator of the valve to control the latter, and being responsive to operation of the timer after said predetermined time interval has elapsed.

3. The invention as defined in claim 1, wherein:
   (a) said operating means comprises a frequency-to-voltage converter, having an input adapted to monitor engine speed,
   (b) said means for rendering inoperative the first mentioned means comprises a timer means, connected with the frequency-to-voltage converter,
   (c) said timer means being automatically re-set in response to the engine speed decreasing from a value above said given speed to a value below said given speed.

4. The invention as defined in claim 1, wherein:
   (a) said operating means comprises a frequency-to-voltage converter, having an input adapted to monitor engine speed,
   (b) said means for rendering inoperative the first mentioned means comprises a timer means, connected with the frequency-to-voltage converter,
   (c) said timer means being automatically rendered operative in response to the engine speed decreasing from a value above said given speed to a value below said given speed.

5. The invention as defined in claim 4, wherein:
   (a) the timer means renders inoperative the operating means only if the engine speed continuously remains below said given speed and there occurs the elapse of a time interval in excess of said second interval.

6. An electronic control circuit for actuating an air-diverter valve connected with the exhaust system of an internal combustion engine to supply air thereto, comprising in combination:
   (a) an electronic timer means adapted to provide a first, finite operating time interval,
   (b) means responsive to a predetermined engine speed, for automatically activating said timer means,
   (c) means connected with the output of said timer means, for operating said air-diverter valve toward its closing position after the expiration of said first operating time interval,
   (d) a second electronic timer means, responsive to engine speed, adapted to provide a second, finite operating time interval, said second, finite operating time interval being shorter than the first,
   (e) means for starting the second timer means after the attainment of said predetermined engine speed and a subsequent drop therebelow, and
   (f) means controlled by the second timer means, for inactivating said first timer means only if the engine speed has remained below said predetermined engine speed continuously for a length of time in excess of said second, finite operating time interval, all to the end that exhaust pollutants are reduced without incurring excessive heating of the exhaust system.

7. The invention as defined in claim 6, wherein:
   (a) said inactivating means also substantially simultaneously re-sets the said first-mentioned timer means.

8. An electronic control circuit for actuating an air-diverter valve connected with the exhaust system of an internal combustion engine to supply air thereto, comprising in combination:
   (a) an electronic timer means adapted to provide a first, finite operating time interval,
   (b) means responsive to a predetermined engine speed, for automatically activating said timer means,
   (c) means connected with the output of said timer means, for operating said air-diverter valve toward its closing position after the expiration of said first, finite operating time interval,
   (d) a second electronic timer means, responsive to engine speed, adapted to provide a second, finite operating time interval, said second, finite operating time interval being shorter than the first,
   (e) means for starting the second timer means after the attainment of said predetermined engine speed and a subsequent drop therebelow, and
   (f) means controlled by the second timer means for re-setting said first timer means only if the engine speed has remained below said predetermined engine speed continuously for a length of time in excess of said second, finite operating time interval, all to the end that exhaust pollutants are reduced without incurring excessive heating of the exhaust system.

9. An electronic control circuit for actuating an air-diverter valve connected with the exhaust system of an internal combustion engine to supply air thereto, comprising in combination:
   (a) timer means responsive to engine speed, for operating said air-diverter valve toward its closing position if a predetermined time interval has elapsed with the engine running above a given speed, and
   (b) holding means, connected with said timer means, for maintaining continuity in the timing operation of the latter during said predetermined time interval, in the event of momentary decreases in the engine speed below said given speed, in order to minimize the possibility of the air-diverter valve being held open by a series of interruptions of said operating means resulting from a successive series of said momentary decreases in engine speed.

10. The invention as defined in claim 9, wherein:
    (a) said operating means comprises an electrical circuit connected with the electrical system of the vehicle carrying the engine, and
    (b) solid state means providing automatic isolation of the circuit in the event that the circuit is inadvertently connected in reverse polarity to the electrical system, so as to prevent possible damage to the said circuit.

11. The invention as defined in claim 9, wherein:
    (a) said momentary decreases are on the order of not in excess of 20 seconds.

* * * * *